United States Patent
Shelton et al.

(10) Patent No.: US 6,849,524 B2
(45) Date of Patent: Feb. 1, 2005

(54) SEMICONDUCTOR WAFER PROTECTION AND CLEANING FOR DEVICE SEPARATION USING LASER ABLATION

(75) Inventors: Bryan S. Shelton, Bound Brook, NJ (US); Mark Gottfried, Hillsborough, NJ (US); Stephen Schwed, Bridgewater, NJ (US); Ivan Eliashevich, South Orange, NJ (US)

(73) Assignee: Emcore Corporation

( * ) Notice: Subject to any disclaimer, the term of this patent is extended or adjusted under 35 U.S.C. 154(b) by 0 days.

(21) Appl. No.: 10/137,904

(22) Filed: May 2, 2002

(65) Prior Publication Data

US 2002/0127824 A1 Sep. 12, 2002

Related U.S. Application Data

(63) Continuation-in-part of application No. 09/178,287, filed on Oct. 23, 1998, now Pat. No. 6,413,839.

(51) Int. Cl.[7] .............................................. H01L 21/46
(52) U.S. Cl. ...................... 438/465; 438/458; 438/460; 438/464
(58) Field of Search .................................. 438/460, 455, 438/458, 461, 462, 463, 464, 465, 113, 114

(56) References Cited

U.S. PATENT DOCUMENTS

| | | | |
|---|---|---|---|
| 3,629,545 A | 12/1971 | Graham et al. | |
| 3,699,644 A | 10/1972 | Cocca | |
| 3,824,678 A | 7/1974 | Harris et al. | |
| 3,970,819 A | 7/1976 | Gates et al. | |
| 4,046,985 A | 9/1977 | Gates | |
| 4,224,101 A | 9/1980 | Tijburg et al. | |
| 4,543,464 A | 9/1985 | Takeuchi | |
| 4,729,971 A | 3/1988 | Coleman | |

(List continued on next page.)

FOREIGN PATENT DOCUMENTS

| | | |
|---|---|---|
| JP | 61-219535 | 9/1986 |
| JP | 63-174793 | 7/1988 |
| JP | 63-183885 | 7/1988 |

OTHER PUBLICATIONS

Jeffery P. Sercel, "Increased Production Using Excimer Lasers Through Enhanced Beam Utilization Factors", SPIE Photonics West Conference, Jan. 26–28, 1998.

Paul C. Remus's letter to Howard Brodie dated on Aug. 20, 2002.

Kevin Carroll's letter to Vincent E. McGeary dated on May 2, 2003.

*Primary Examiner*—Kevin M. Picardat
(74) *Attorney, Agent, or Firm*—Gibbons, Del Dio, Dolan, Griffinger & Vecchione

(57) ABSTRACT

A method of protecting and cleaning a semiconductor wafer using laser ablation includes the following steps: applies a protective coating on the side to be cut of a wafer with sapphire substrate, mounts the other side of the sapphire wafer on an adhesive tape, mounts the sapphire wafer on a cutting table, cuts the sapphire wafer with a laser, breaks the sapphire wafer into die, and cleans the sapphire wafer with a cleaning solution that removes slag resulting from the cutting, debris resulting from the breaking, and the protective coating, but the adhesive tape, the cleaning solution, and the protective coating are selected such that the cleaning solution does not damage the adhesive tape.

72 Claims, 11 Drawing Sheets

U.S. PATENT DOCUMENTS

| | | | |
|---|---|---|---|
| 4,851,371 A | 7/1989 | Fisher et al. | |
| 4,865,686 A | 9/1989 | Sinohara | |
| 4,964,212 A | 10/1990 | Deroux-Dauphin et al. | |
| 4,992,393 A | 2/1991 | Kosaka et al. | |
| 5,075,201 A | 12/1991 | Koh | |
| 5,151,389 A | 9/1992 | Zappella | |
| 5,185,295 A | 2/1993 | Goto et al. | |
| 5,214,261 A | 5/1993 | Zappella | |
| 5,385,633 A | 1/1995 | Russell et al. | |
| 5,543,365 A | 8/1996 | Wills et al. | |
| 5,552,345 A | 9/1996 | Schrantz et al. | |
| 5,597,767 A * | 1/1997 | Mignardi et al. | 438/464 |
| 5,631,190 A | 5/1997 | Negley | |
| 5,641,416 A | 6/1997 | Chadha | |
| 5,864,171 A | 1/1999 | Yamamoto et al. | |
| 5,872,046 A | 2/1999 | Kaeriyama et al. | |
| 5,912,477 A | 6/1999 | Negley | |
| 5,922,224 A | 7/1999 | Broekroelofs | |
| 5,932,118 A | 8/1999 | Yamamoto et al. | |
| 5,976,691 A | 11/1999 | Noguchi et al. | |
| 6,063,696 A * | 5/2000 | Brenner et al. | 438/465 |
| 6,117,347 A | 9/2000 | Ishida | |
| 6,140,151 A | 10/2000 | Akram | |
| 6,225,194 B1 | 5/2001 | Noguchi et al. | |

* cited by examiner

SEMICONDUCTOR WAFER PROTECTION AND CLEANING FOR DEVICE SEPARATION USING LASER ABLATION

CROSS-REFERENCE TO RELATED APPLICATIONS

This application is a continuation-in-part of U.S. patent application No. 09/178,287, now U.S. Pat. No. 6,413,839, entitled "SEMICONDUCTOR DEVICE SEPARATION USING A PATTERNED LASER PROJECTION," filed Oct. 23, 1998. This application is also related to co-pending U.S. patent application No. 10/146,267, (Emcore 6) entitled "SEMICONDUCTOR DEVICE SEPARATION USING A PATTERNED LASER PROJECTION," filed on May 15, 2002.

FIELD OF THE INVENTION

This invention relates to the field of semiconductor fabrication, and more particularly to semiconductor device separation.

BACKGROUND OF THE INVENTION

In the field of semiconductor device fabrication, there are various methods for separating a wafer into die, including scribe and break techniques. In scribe and break techniques, the die is separated by breaking the wafer along scribe lines, which can be cut in the wafer in a number of ways. For example, wafers having semiconductor substrates can be mechanically scribed, such as with a diamond. In wafers having sapphire substrates, laser scribing has been disclosed, as, for example, in U.S. patent application No. 09/178,287, entitled, "Semiconductor Device Separation Using a Patterned Laser Projection," which is incorporated herein by reference. The device separation method disclosed therein uses laser ablation to form scribe lines in the wafer.

Because scribing removes material from the wafer, some scribing techniques can result in the buildup of waste material on the wafer. In laser ablation scribing, for example, waste substrate material, also referred to as slag, tends to form as residue on the wafer. The slag forms on the sidewall and around the die perimeter, building from the bottom of the cut to the top. That is, there tends to be more slag near the top of the cut than the bottom. Slag around the die perimeter can degrade the reliability of the device and inhibit wire bonding. In optical devices, such as LED's and lasers, sidewall buildup can decrease the power output of the device, as the slag can absorb some of the optical output power of the device.

It has been suggested that a protective coating of a photoresist material can be used to protect the topside of the die from waste material. The material is applied and then cured to form the protective coating. The coating, of course, must be removed at some point in the separation process, such as by using a solvent. Known uses of photoresist protective coating techniques tend to decrease process times as additional activities or steps must be carried out in the separation process. In device fabrication, processes that deliver high yields in short times are desirable, as even relatively minor increases in efficiency can lead to significant increases in device throughput.

SUMMARY OF THE INVENTION

A method according to the principles of the present invention provides for efficient device separation processing by using compatible materials. In one aspect, processing steps are minimized by choosing compatible materials for mounting the wafer, protecting the devices and cleaning off the protective coating. In one embodiment, the method includes the step of applying a protective coating on the side to be cut of a semiconductor wafer, mounting the other side of the semiconductor wafer on a mounting material such as an adhesive tape, cutting the semiconductor with a laser beam, and cleaning the wafer with a cleaning agent. The mounting material, the cleaning agent, and the protective coating are selected such that the cleaning agent does not damage the mounting material but removes the protective coating. Specifically, when an adhesive tape is used as the mounting material, the cleaning agent does not damage the adhesive and the tape forming the adhesive tape. As a result, the semiconductor wafer remains on the mounting material during and after the cleaning process, increasing the efficiency of the process.

In another exemplary embodiment, the method of the invention includes the following steps: applying a protective coating on the side to be cut of a wafer with sapphire substrate, mounting the other side of the wafer on an adhesive tape, mounting the wafer with the adhesive tape on a cutting table, cutting the wafer with a laser, breaking the wafer into die, and cleaning the wafer by a wet etch with a cleaning solution. The cleaning solution, the protective coating, and the adhesive tape are selected such that the cleaning solution removes slag resulting from the cutting, debris resulting from the breaking, and the protective coating, but does not damage the adhesive tape, so that the die can remain on the adhesive tape before, during and after the cleaning.

BRIEF DESCRIPTION OF THE DRAWINGS

A more complete understanding of the invention may be obtained from consideration of the following description in conjunction with the drawings in which.

DETAILED DESCRIPTION

Figure 1:
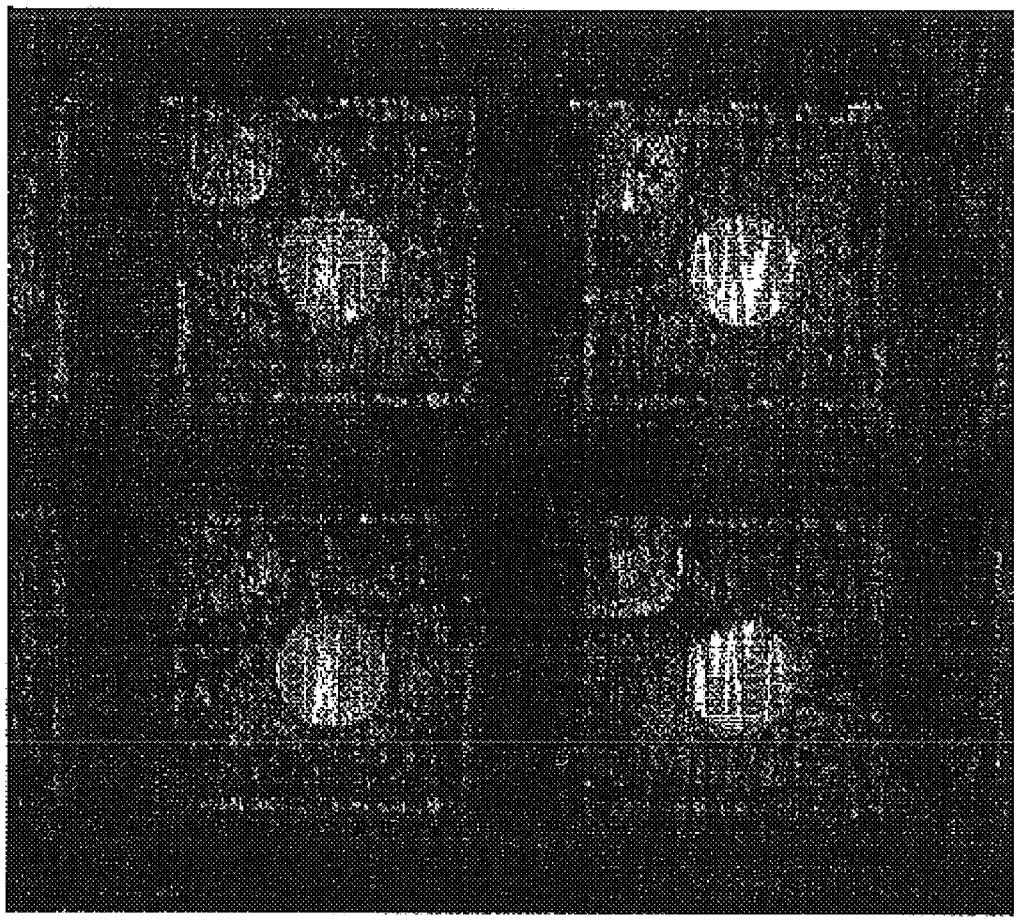
FIG. 1 is a photograph of a die cut by laser ablation covered with a deposit of slag.

With reference to the figures for purposes of illustration, the present invention relates generally to an efficient process for die separation. Because of the large amount of energy needed to remove sapphire from a cut area using laser ablation, the waste sapphire tends to form a residue that cannot be removed easily. This waste, or slag, as it is commonly referred to, has two effects on subsequent die yield from the separation process. First, the top surface of the die has been found to have a large buildup of material around the perimeter of the die that degrades reliability and prevents wire bonding of the die. If the die size is generally less than 0.5 mm square, the entire surface can be covered by slag as illustrated by FIG. 1. Secondly, sidewalls of the die which are exposed during ablation have a slag buildup that increases from the bottom to the top of the cut. This excess material decreases the output power of the die since it is absorbing. Given that the comparable hardness of the diamond, used in conventional scribing and dicing saw tools, and the sapphire make traditional separation processes very inefficient, experiments were conducted to discovers techniques to improve the die yield.

Figure 2:
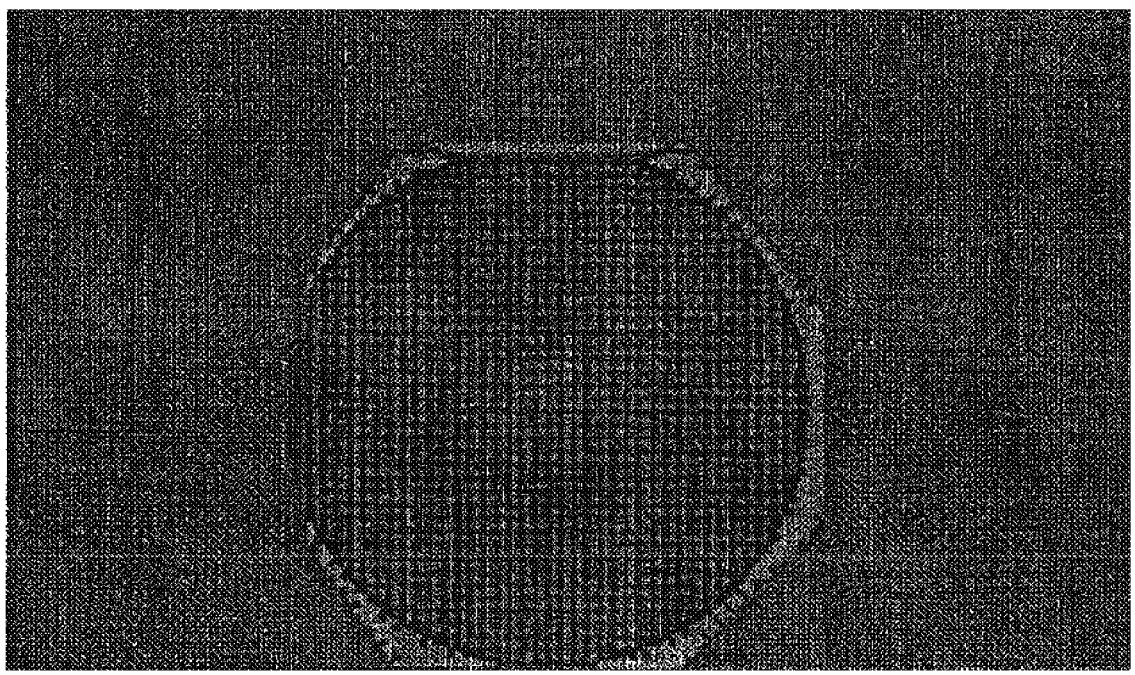
FIG. 2 is a photograph of a wafer cut into die by laser ablation and covered with a deposit of slag.
Figure 3A:
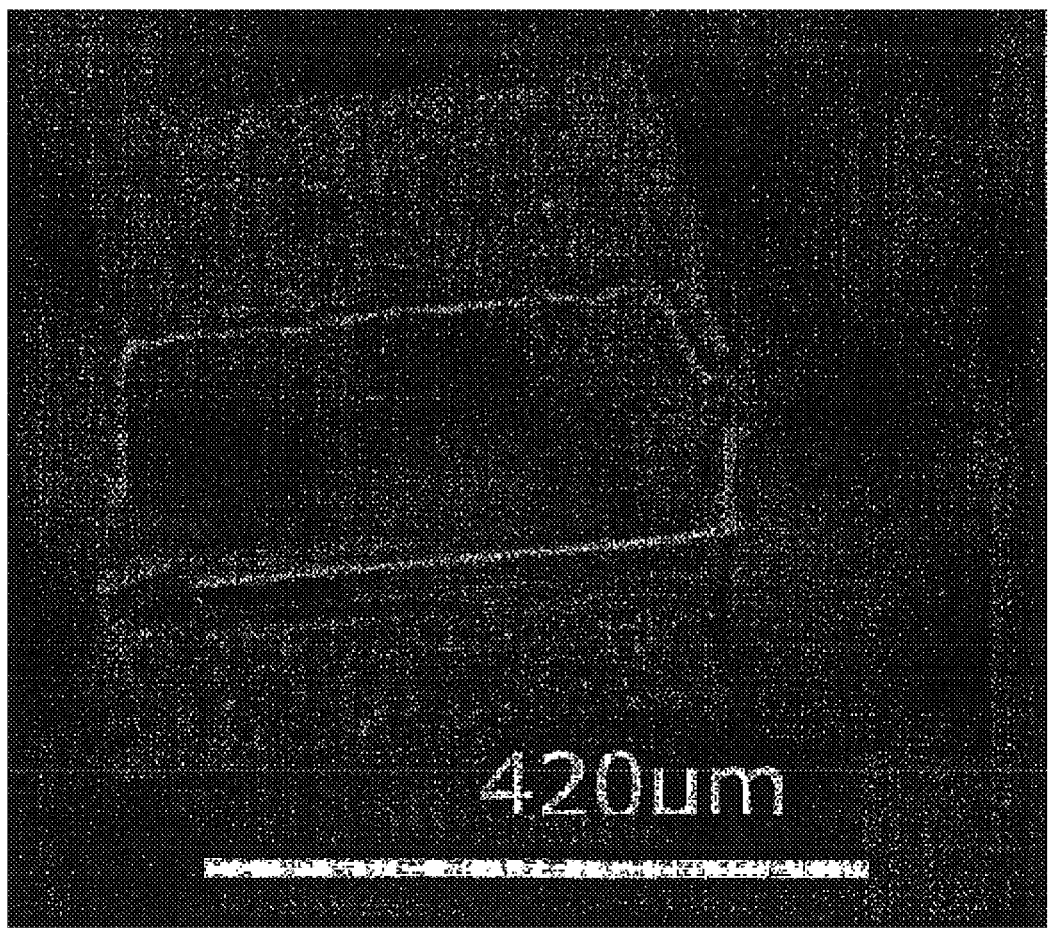
FIG. 3A is a photograph of a sidewall of a die cut by laser ablation shown at an intermediate cleaning step in accordance with a method of the present invention.
Figure 3B:
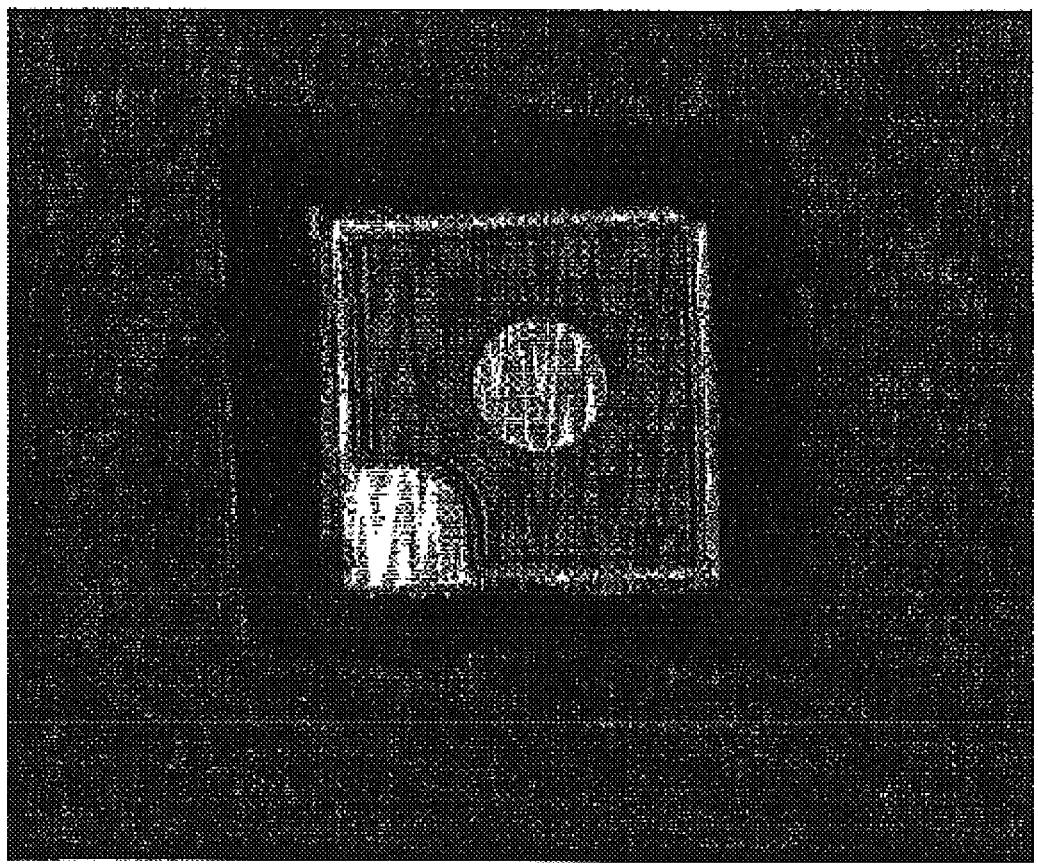
FIG. 3B is a photograph of a top view of the die shown at the intermediate cleaning step of FIG. 3A.
Figure 3C:
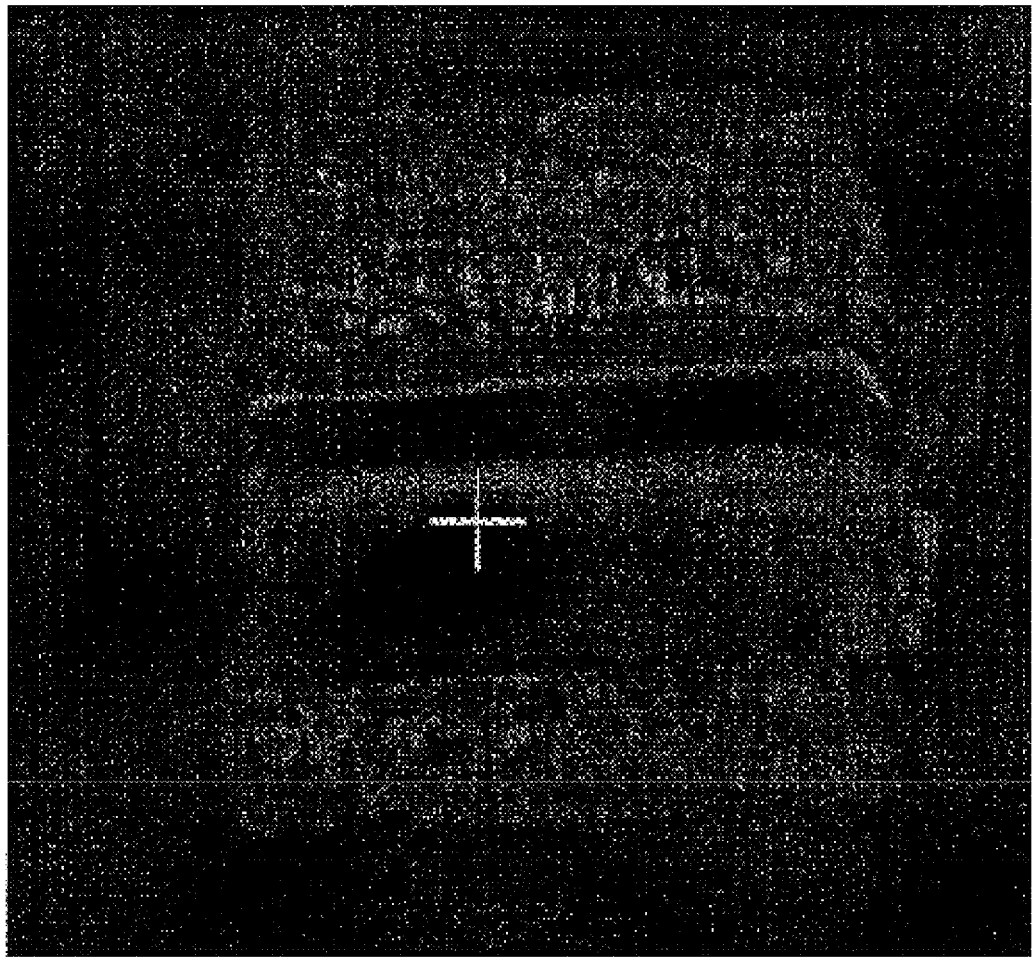
FIG. 3C is a photograph of the sidewall of the die of FIG. 3A shown upon completion of cleaning.
Figure 3D:
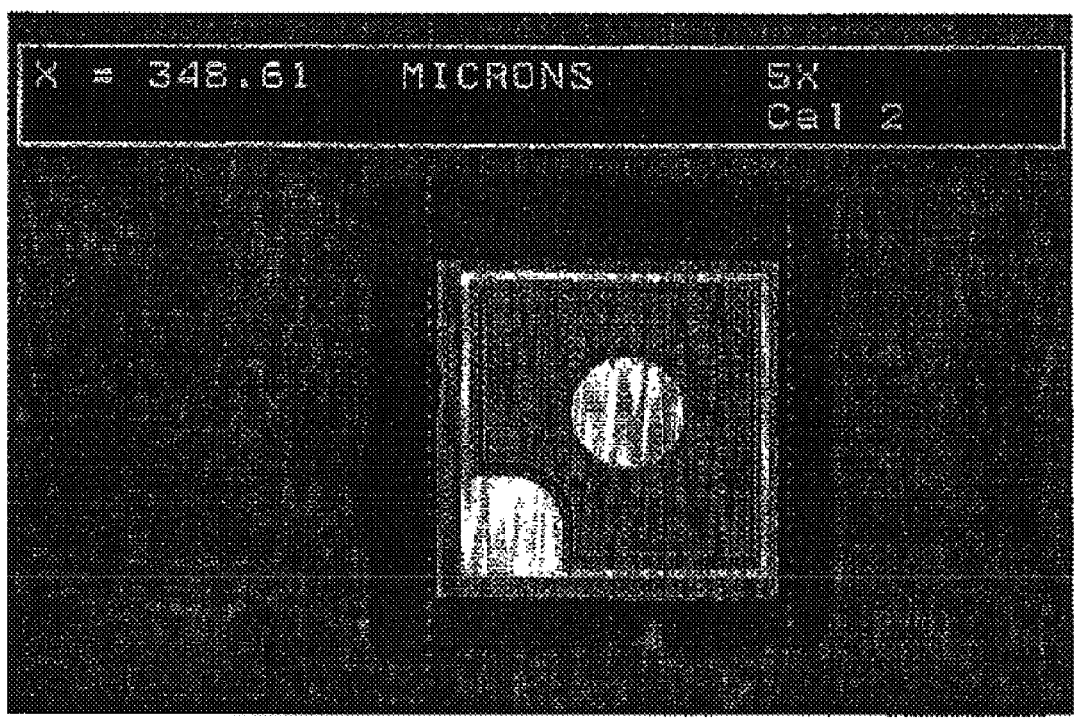
FIG. 3D is a photograph of a top view of the die shown upon completion of cleaning of FIG. 3C

The experiments were conducted using a 248 nm KrF excimer laser on wafers composed of GaN/sapphire and sapphire that made cut depths in the range of 1 to 6 mil on one or both sides of the wafer. The kerf width was a maximum of 4 mil with sharp edges as illustrated in FIG. 1. An example of a whole wafer cut with the laser is illustrated in FIG. 2. The series of experiments were directed at discovering ways to improve die yields while minimizing the number of steps required for separation. The following approaches were attempted during the die separation process and each resulted in an improvement of the die yield:

a. variations on applying to the front surface of the wafer a protective coating;
b. variations on applying to the back surface of the wafer a protective coating;
c. variations on applying and removing an adhesive tape on the side of the wafer facing away from the laser;
d. variations on cleaning the die using a wet chemical etch to remove the protective coating and clean the side walls of the die:
e. variations on cleaning the die using a dry etch to remove the protective coating and clean the side walls of the die; and
f. variations on using a sonic bath using ultrasonic and megasonic frequencies for the wet chemical etching to accelerate and improve the cleaning efficiency.

During these experiments, yield improvements were attained while varying each of the above approaches. Advantageously, an unexpected result of these experiments was the discovery that, while each of these approaches can be varied to improve yield rates, the existence of certain interdependencies in the process steps and compatibility between certain materials obtained greater yield rates. Such yield rates were not obtained when these interdependencies and compatibilities did not exist. This discovery means that higher yield rates can be obtained while allowing for manufacturers to mix and match their process steps as may be desirable when varying, by way of example not by limitation, the device structure thickness, surface morphology and size.

It will be understood by one of ordinary skill in art that the interdependencies and compatibilities described herein can be used to develop critical process protocols tailored to particular separation systems and desired end products. From the above experiments, the following interdependencies and compatibilities were discovered:

1. The coating technology to protect the wafers from damage from the laser ablation should be compatible with the sapphire wafer, adhesive tape, and cleaning solution.
2. The cleaning steps of a wet chemical etch and a dry etch are interchangeable and/or may be used in combination. When used in combination, more sidewall slag was removed from the edge of the die and improved efficiency in the die was observed.

The consideration of either or both of these features was found to have improved yield rates. Furthermore by practicing these principles, it was discovered that separation processes including the steps of protecting at least one surface of the wafer with a coating, applying an adhesive tape compatible with the desired cleaning solution, and using a dry etch and/or wet etch in ultrasonic to clean the surfaces were now feasible. The flexibility and the ease of use of these process steps permit a manufacturer to quickly and inexpensively separate die in any manufacturing program while producing a finished product free of surface or sidewall contamination and increasing yield while at the same time creating higher efficiency die. With reference to FIGS. 3A-D, an actual die was obtained relatively free of slag in accordance with the method illustrated in FIG. 7 discussed in greater detail below. The die was photographed for FIGS. 3A and 3B during an intermediate cleaning step and photographed for FIGS. 3C and 3D upon completion of the method of FIG. 7. While these discoveries are particularly well suited for wafers based on a sapphire substrate undergoing separation by laser ablation, these results are not intended to limited to such wafers and separation techniques. The application of these techniques in exemplary die separation processes are more fully set forth below.

By way of example, and not by limitation, the exemplary processes of the present invention are described utilizing a conventional laser-separation system. However, those skilled in the art will appreciate that any conventional wafer cutting tool system such as dicing saw or scribe-break systems may substitute for the laser. A laser separation system of the type suitable for the present invention includes a KrF laser with wavelength of 248 nm (nanometers), and maximum pulse energy of 400 mJ (millijoule), such as the IX-1000 laser workstation made by JP SERCEL ASSOCIATES, INC. However, any laser that has the power, wavelength and frequency, for die separation may be used. Such lasers may include, but are not limited to KrF lasers, Nd:YAG lasers. Advantageously, the process of the present invention minimizes the steps required for conventional die separation system by using compatible materials.

Figure 4:
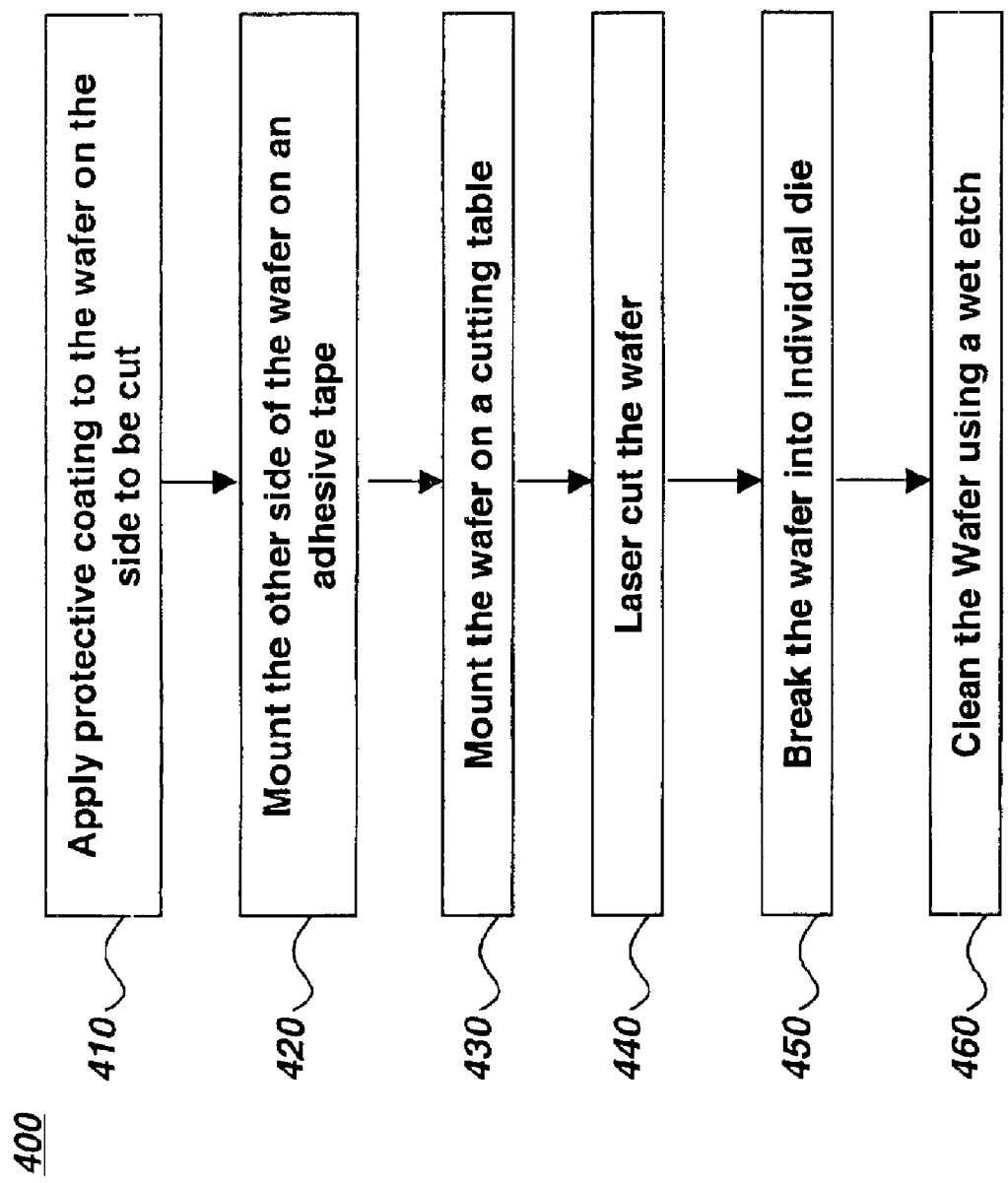
FIG. 4 shows an exemplary method of protecting and cleaning a wafer separated using laser cuts on a single side.

Referring to FIG. 4, an exemplary method 400 for protecting and cleaning a semiconductor wafer separated using laser cuts on a single side of a semiconductor wafer. The method 400 protects the semiconductor wafer from slag (waste substrate) resulting from laser cutting and debris resulting from breaking the semiconductor wafer into die after the laser cutting. For illustration purposes, the wafer includes a sapphire substrate and a device layer. However, any substrate and device layer combination can be used without departing from the principles of the invention. The device layer preferably is a nitride layer such as gallium nitride (GaN), aluminum nitride, and indium nitride. At step 410, the wafer is applied with a protective coating to the side to be cut, i.e., the side facing the laser beam. The protective coating prevents contamination from the slag resulting from the actual cutting process at step 440. At step 420, the wafer is mounted with a mounting material. For illustration purposes, the mounting material in this and other methods described below is an adhesive tape coated with a generally high tack adhesive. Note that the side not facing the laser beam is mounted on the adhesive tape. At step 430, the wafer is mounted on a cutting table, and is laser cut at step 440 using ablation.

The cutting may deposit slag on the top of the semiconductor wafer and on both sides of each cut. At step 450, the wafer is broken into die using conventional methods such as roller breaking and 3-point bending. Advantageously, the wafer remains on the adhesive tape during and after the breaking process. At this point, in addition to the slag, debris resulting from the breaking step may have been deposited on the wafer.

At step 460, the wafer is cleaned using a wet etch. In accordance with the principles of the invention, the cleaning solution used in the wet etch, the protective coating, and the adhesive tape are selected in such a way that the cleaning solution removes the protective coating, the slag, and the debris, but does not damage the adhesive tape and the die. Examples of the cleaning solution are solutions that include one or more of the following solvents: n-methyl pyrrolidone (NMP), dipropylene glycol monomethyl ether, polyglycol ether, tetrahydo thiophene dioxide, non-aqueous quaternary ammonium hydroxide, potassium borate, and potassium hydroxide (KOH). For example, EKC-830 includes NMP and Photoresist developer AZ400K includes both KOH and potassium borate. Examples of the protective coating are photoresists utilizing an organic backbone comprised of cresol novolac resins such as photoresist AZ4330RS having diazonaphthoquinone sulfonic ester or trihydroxybenzophenone. An alternate useful organic backbone material is polyhydroxystyrene. Examples of the adhesive tape are conventional medium tack tapes such as P/N 18074-10.00 from SEMICONDUCTOR EQUIPMENT CORPORATION and conventional high tack tapes such as Type 1004R adhesive tape from ULTRON SYSTEMS. Also, UV release tape may be used. Although any combination of the above can be used, the preferred combination is EKC-830, photoresist AZ4330RS, and a conventional medium tack tape for the cleaning solution, the protective coating, and the adhesive tape, respectively. Advantageously, such a selection enables the wafer to remain on the adhesive tape during and after the cleaning step, increasing the efficiency of the separation process.

A conventional medium tack tape can be used as a protective coating as well. In this case, the protective coating is not removed by the cleaning solution and is peeled off before or after the cleaning step. More than one medium tack tape can be used as the protective coating during the dicing of the wafer. For example, after cutting the wafer in one direction, the medium tack tape is replaced with another before cutting the wafer in another direction.

The cleaning step can also use a dry etch, or a dry etch followed by a wet etch. If a dry etch is used, the cleaning agent is not a cleaning solution. Rather, the cleaning agent is referred to as the plasma cleaning process. The preferred cleaning agent for a dry etch is the chlorine-based plasma. The preferred protective coating and adhesive tape are photoresist AZ4330RS, and a conventional medium tack tape, respectively. One advantage of using a dry etch with a protective coating is that the protective coating acts as a mask for the die. Thus, the dry etch effectively cleans the sidewalls without damaging the die. If only a dry etch is used and no wet etches follow, the debris and the protective coating would not be removed. In this case, the debris can be removed by using solution such as KOH in a cleaning tank such as an ultrasonic tank, or solution such as EKC-830 in an ULTRA-T wafer cleaner. The protective coating may be removed in a similar manner. To avoid the additional effort for removing the debris and the protective coating, after a dry etch, a wet etch is applied.

Method 400 has the wafer broken up at step 450 before cleaning the wafer at step 460. An advantage of the arrangement is that the slag and the debris are removed simultaneously. If the debris is not a concern, steps 450 and 460 can be reversed. That is, the cleaning step 460 is performed right after the cutting step 440 and before the breaking step 450. In this exemplary case, the cleaning solution is not required to remove the debris resulting from the breaking step. The preferred cleaning solution, the protective coating, and the adhesive tape are Photoresist developer AZ400K, photoresist AZ4330RS and a conventional medium tack tape, respectively. If a dry etch is used, the preferred combination of the cleaning agent, the protective coating, and the adhesive tape is the same as those stated previously.

If the laser cut is not a complete cut, another change that can be made to method 400 is to perform adhesive tape mounting step 420 immediately before breaking step 450. This is because the wafer remains together without the help of a adhesive mounting tape during and after cutting step 440, but to keep the wafer together during and after breaking step 450, the adhesive tape is preferred.

Figure 5:
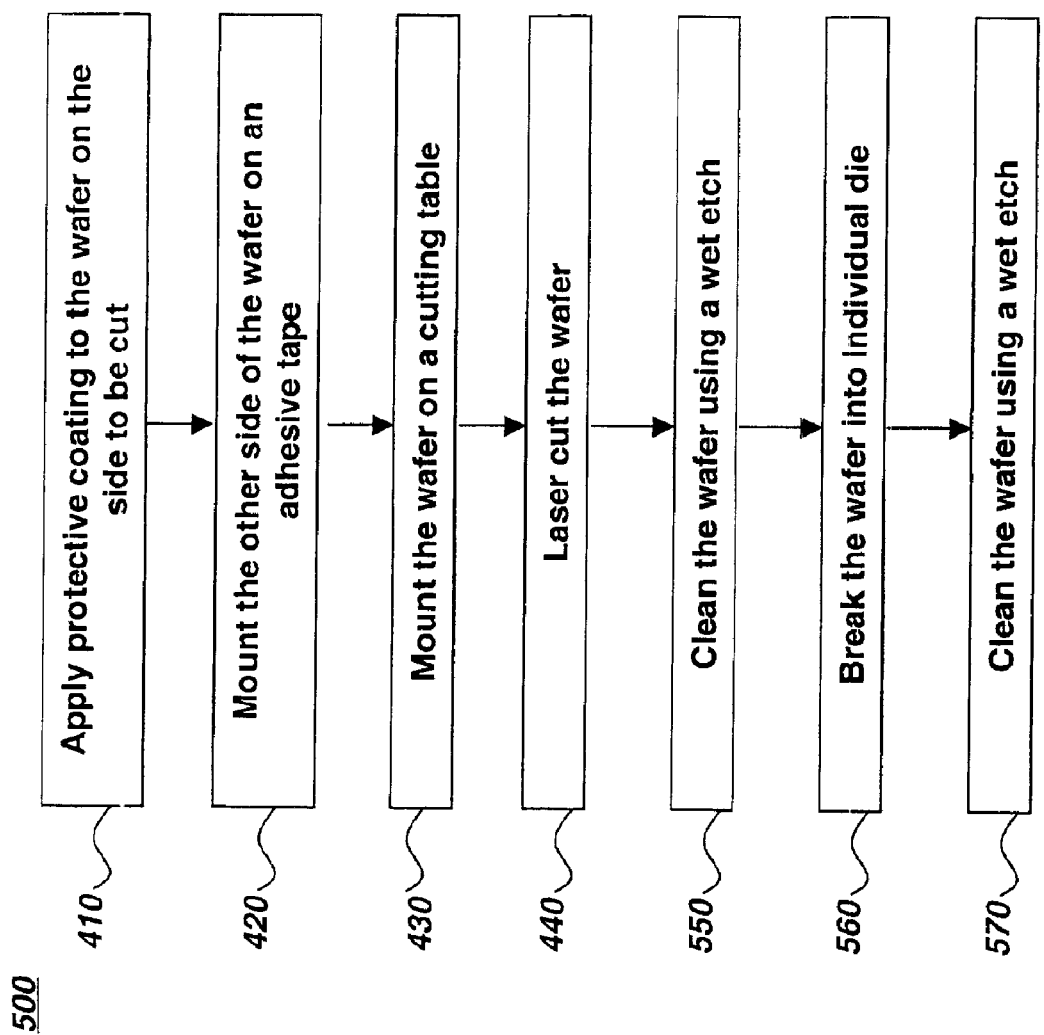
FIG. 5 shows another exemplary method of protecting and cleaning a wafer separated using laser cuts on a single side.

Referring now to FIG. 5, illustrative method 500, which is an alternative to method 400, is shown. The first four steps are the same as those in method 400 and are labeled the same as in FIG. 4. Instead of performing one cleaning step, method 500 performs two cleaning steps. The first cleaning step (step 550) is performed after the cutting step 440 but before the breaking step 560, so that the protective coating and the slag resulting from the cutting are removed. Whereas the second cleaning step (step 570) is performed after the breaking step 560, so that debris resulting from the breaking is removed. The first and the second cleaning steps are performed with a wet etch. They also can be performed with a dry etch, or a dry etch followed by a wet etch as well. The cleaning solution selected for the second cleaning step can be different from that selected for the first cleaning step.

In accordance with the principles of the invention, cleaning solutions selected for the first cleaning step should be able to remove the protective coating and the slag but do not need the capability for removing the debris, and those selected for the second cleaning step should remove the debris but do not need the capability to remove the slag or the protective coating. The solution selected for either step should not damage the adhesive tape and the die. The preferred protecting coating and the adhesive tape are photoresist AZ4330RS and a conventional medium tack tape, respectively. A conventional medium tack tape can also be used as the protective coating, and a conventional high tack tape can also be used as the adhesive tape. The preferred cleaning solutions used in the first and the second cleaning steps are Photoresist developer AZ400K and EKC-830, respectively. It should be noted that KOH can also be used as the cleaning solution at the second cleaning step and that the solutions used in the second cleaning step can also be used in the first cleaning step.

If a dry etch is used, the preferred combination of the cleaning agent, the protective coating, and the adhesive tape is the same as those described for the method shown in FIG. 4. To also remove the debris and the protective coating, at the second cleaning step, a wet etch with EKC-830 or KOH can follow the dry etch.

If the debris is not a concern, step 570 can be omitted. Furthermore, if the cut is not a complete cut, step 420 can be done immediately before breaking step 560, because cutting step 440 and cleaning step 550 do not require an adhesive tape to hold the wafer together.

Figure 6:
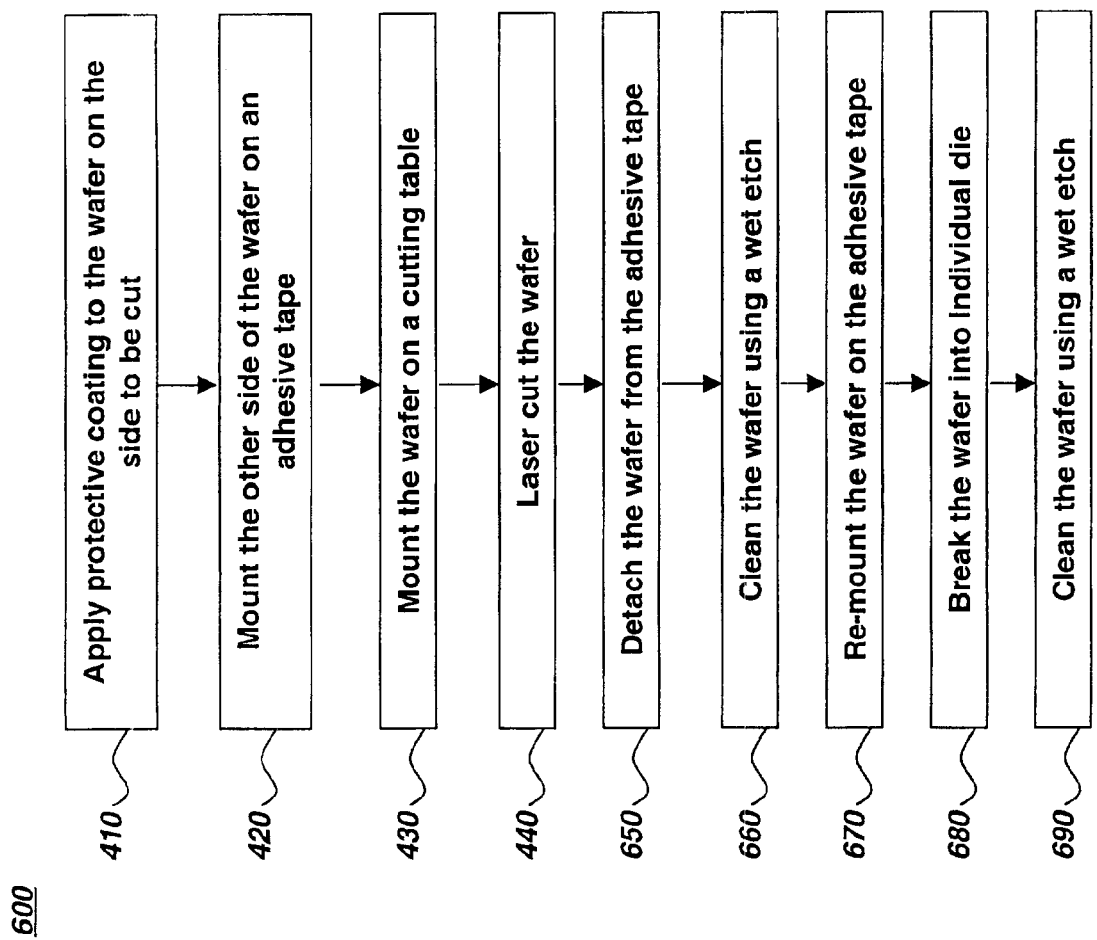
FIG. 6 shows yet another exemplary method of protecting and cleaning a wafer separated using laser cuts on a single side.

Referring now to FIG. 6, illustrative method 600 for protecting and cleaning a wafer separated using laser cut is shown. The first four steps are the same as those in method 400 and are labeled the same as in FIG. 4. After cutting step 440, the wafer is detached from the adhesive tape at step 650 and is cleaned with a cleaning solution using a wet etch at step 660. Both steps 650 and 660 should not break the wafer. The slag resulting from cutting step 440 and the protective coating are removed at step 660. The wafer is then re-mounted on the same adhesive tape at step 670 and is broken into die using conventional methods at step 680. A second cleaning step is then performed at step 690 to remove the debris resulting from the breaking step 680. The method of cleaning in both steps 660 and 690 is a wet etch but it can be a dry etch, or a dry etch followed by a wet etch. The cleaning solution for step 690 can be different from step 660. The cleaning solution for the first cleaning step (step 660) is able to remove the protective coating and the slag but is not restricted to those types that do not damage the adhesive tape. The cleaning solution for step 690 removes the debris but does not need the capability to remove the slag or the protective coating. The cleaning solution selected in the second step (step 690) is of the type that does not damage the adhesive tape and the die. The preferred and other combinations of the cleaning agents in the two cleaning steps, the protective coating, and the adhesive tape are the same as those respective steps described for the method shown in FIG. 5.

Steps 410 and 420 in methods 400, 500, and 600 can be done in any sequence. For example, step 420 can be done before step 410, or both steps can be done simultaneously.

The methods described so far have been applicable to a wafer that is separated on one side using a laser beam (the single cut approach). For a thick wafer, the single cut approach may cause the wafer to crack or produce more waste because of the depth of the cut. Furthermore, there is a saturation point on each side of the wafer that limits the cut depth. The depth of the saturation point varies based on the laser system and laser used, but is approximately 150.m (micrometer); the wafer thickness can be more than 150.m, generally, about 425.m. One way to solve the problems is to make partial cuts on each side of the wafer (the double cut approach). An advantage of the double cut approach is that there is no need to thin the wafer; thus, the processing time is reduced and the efficiency is increased. Also, cutting the wafer from the top and bottom results in more uniform devices, as the break between the cut tends to stay closer to perpendicular to the wafer surfaces. Where high quality optical devices are desirable, the double cut approach may be preferable due to the just described break lines.

Figure 7:
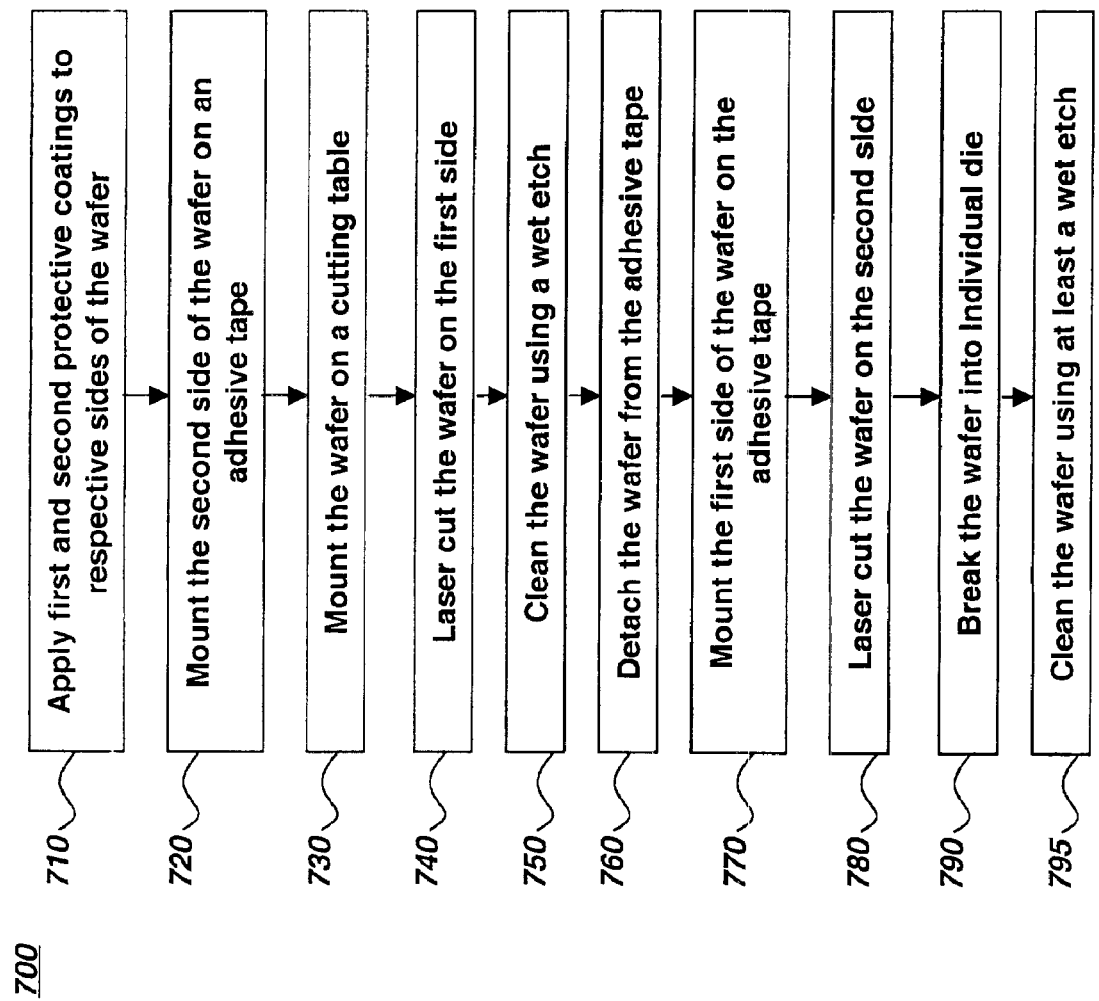
FIG. 7 shows an exemplary method of protecting and cleaning a wafer separated using laser cuts on each side.

FIG. 7 shows an exemplary method 700 for wafer protection and cleaning when the double cut approach is used. Again, for illustration purposes, the wafer includes a sapphire substrate and the laser separation is accomplished using laser ablation.

At step 710, first and second protective coatings are applied to respective sides of the wafer. Here, the side to be cut first is called the first side and the other side, the second side. Preferably, the first side is the substrate side. The first side usually is not the side that is faced up for subsequent packaging to avoid the additional effort of re-mounting.

At step 720, the second side of the sapphire is mounted on an adhesive tape with the first side facing the laser beam, and the wafer is then mounted on a cutting table at step 730. At step 740, the wafer is cut on the first side and the wafer is then cleaned with a wet etch at step 750. In accordance with the principles of the invention, the cleaning solution selected at step 750 should remove the first protective coating from the first side and the slag generated at step 740, but should not damage the adhesive tape and the die. The second protective coating, even if it is the same type as the first protective coating, is not damaged by step 740 because it is positioned against the adhesive tape. This selection of the cleaning solution, the adhesive tape, and the first and second protective coatings minimizes the handling and process time in the lab. Without this selection, further cleaning on the first side would be impossible prior to packaging.

At step 760, the wafer is detached from the adhesive tape, and the first side of the wafer is then mounted on the adhesive tape at step 770, i.e., the second side faces the laser beam. The second side of the wafer is then cut at step 780, and broken into die using conventional methods, as at step 790. The wafer is cleaned again using at least a wet etch with a different cleaning solution, as at step 795. In accordance with the principles of the invention, the cleaning solution used at step 795 should remove the slag produced at step 780, the debris produced at step 790, and the second protective coating, but it should not damage the adhesive tape and the die. The preferred and other cleaning agents for the first (step 750) and the second (step 795) cleaning steps are the same as those described for the respective steps in FIG. 5. The preferred and other adhesive tapes are also the same as those disclosed for the method shown in FIG. 5. Photoresist AZ4330RS is preferred for both protective coatings, although a conventional medium tack tape can be used as well, and the two protective coatings can be different.

Furthermore, it is preferred that at the second cleaning step (step 795), two wet etches are used. The cleaning solutions used in these two wet etches are the same but they can be different.

Both cleaning steps may involve a dry etch before a wet etch. For cleaning step 795, it is preferred that two wet etches follow the dry etch. As in method 400, if the debris is not a concern, steps 790 and 795 can be reversed, and the cleaning solution selected at step 795 is not required to remove the debris.

As discussed above the die shown in FIG. 3 was produced according to the method of FIG. 7 as follows:

710—Coat both sides of wafer with photoresist.
720—Mount the frontside of wafer medium tack tape.
730—Mount wafer on table.740
740—Laser cut wafer to a depth of 90 microns.
750—Cleaned the wafer with a wet etch.
760—De-mount the wafer from the tape.
770—Mount the backside of wafer on high tack tape.
780—Laser cut wafer to a depth of 120 microns.
790—Break wafer with a roller into individual die.
795'—Cleaned the wafer with a wet etch with AZ400K+ EKC-830. The photos of FIGS. 3 and 3B were taken upon completion of this intermediate cleaning step.
795"—Cleaned the wafer with a wet etch of KOH and ultrasonic. The photos of FIGS. 3C and 3D were taken upon completion of cleaning.

Figure 8:
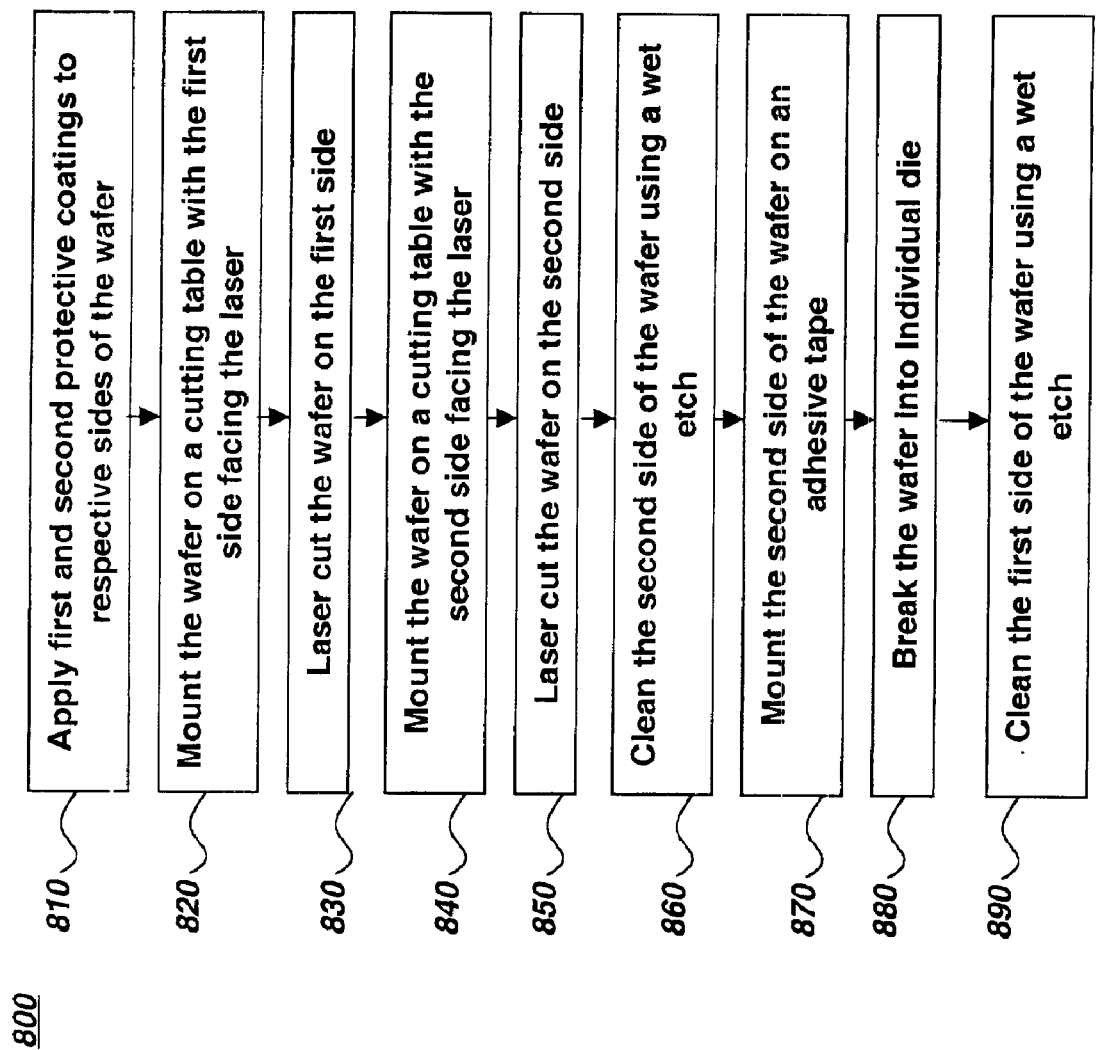
FIG. 8 shows another exemplary method of protecting and cleaning a wafer separated using laser cuts on each side.

The step of mounting a wafer on an adhesive tape can be deferred until the wafer is ready to be broken into die. FIG. 8 illustrates method 800 incorporating this feature. After applying first and second sides with respective coatings at step 810, the wafer is mounted on the cutting table with the first side facing the laser as at step 820. At step 830, the wafer is cut on the first side. At step 840, the wafer is re-mounted on the cutting table with the second side facing the laser, and, at step 850, the wafer is cut on the second side. The second side is, then, cleaned at the first cleaning step 860. At step 870, the second side of the wafer is mounted on an adhesive tape, and, at step 880, the wafer is broken into die. At step 890, the first side of the wafer is cleaned. For the preferred and other selections of the adhesive tape and the protective coatings, see method 700. For the preferred and other cleaning agents for steps 860 and 890, see those described in method 700 for steps 795 and 750, respectively.

In one embodiment, the first side can be cleaned at step 860 and the second side at step 890. In this embodiment, the wafer should be mounted on the cutting table with the first side facing the laser before step 860 and, at step 870, the first side should be mounted with the adhesive tape.

Furthermore, at step 860, both first and second sides can be cleaned and, at step 870, the wafer is mounted on the adhesive tape on either side for broken into die at step 880. In this embodiment, step 890 can be omitted or be used for more cleaning it the wafer is still dirty.

In the methods described above, if EKC-830 or KOH is used at a cleaning step using a wet etch, ultrasonic agitation or megasonic agitation can be incorporated as part of the wet etch. The sonic wave breaks up the protective coating and slag that has stuck to the wafer, making the protective coating and the slag easier to be dissolved by the cleaning solution. An advantage of ultrasonic or megasonic processing is that the processing improves the efficiency of the cleaning without damaging the wafer.

Although the above description primarily refers to cutting gallium nitride (GaN) on C-plane sapphire, these are only illustrative materials. The epitaxial growth material can be, for example, any semiconductor material such as any of the III-V materials listed in the periodic chart of elements. The substrate material can be, for example, silicon, any of the III-V materials, refractory ceramics and any orientations of any of the listed substrate materials. When any of the III-V materials is used as the substrate and a wet etch is used, KOH should be used as the cleaning solution. For other substrate materials, all cleaning agents disclosed previously can be used.

In another embodiment, the wafer is mounted on a pedestal and mounting tape is not used. The pedestal holds the wafer for cutting by the laser, and permits the wafer to be cut to its periphery. Some protective coating is applied prior to mounting on the pedestal. After the laser is applied, the wafer is removed and cleaned. The cut, cleaned wafer is then placed on mounting tape and broken. The wafer is then optionally cleaned, preferably using a cleaning agent that does not degrade the tape.

In accordance with the invention, methods for protecting and cleaning a semiconductor wafer separated using laser are described. Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure and the procedure may be varied substantially without departing from the spirit of the invention and the exclusive use of all modifications which come within the scope of the appended claim is reserved.

What is claimed:

1. A method for dicing a semiconductor wafer into die, the method comprising the steps of:
    applying a first protective coating to a first side of the wafer;
    mounting the semiconductor wafer on a mounting material with a second side of the wafer facing the mounting material;
    inscribing the semiconductor wafer into die pattern without breaking the wafer;
    breaking the wafer into die without removing the mounting material; and
    cleaning mounted die with a cleaning agent for removing the first protective coating and slag.
2. The method of claim 1, wherein the mounting material is not damaged by the cleaning agent for at the cleaning step.
3. The method of claim 1, wherein the inscribing step uses a laser.
4. The method of claim 3, wherein the inscribing step uses laser ablation.
5. The method of claim 1, further comprising the step of mounting the semiconductor wafer on the cutting table before the inscribing step.
6. The method of claim 1, wherein cutting the semiconductor wafer provides partially cuts and further comprising the step of breaking the semiconductor wafer into the die using the partial cuts.
7. The method of claim 6, wherein the breaking is mechanical.
8. The method of claim 7, wherein the mechanical breaking is performed by roller breaking.
9. The method of claim 1, wherein the semiconductor wafer comprises a sapphire substrate and a device layer.
10. The method of claim 9, wherein said device layer comprises a nitride device layer.
11. The method of claim 10, wherein the nitride device layer comprises gallium nitride.
12. The method of claim 10, wherein the nitride device layer comprises indium nitride.
13. The method of claim 1, wherein the cleaning agent also removes slag resulting from the cutting step.
14. The method of claim 1, wherein the step of cleaning is performed using a wet etch.
15. The method of claim 14, wherein the wet etch incorporates the use of ultrasonic agitation.
16. The method of claim 14, wherein the wet etch incorporates the use of megasonic agitation.
17. The method of claim 14, wherein the cleaning agent is potassium hydroxide and the mounting material is an adhesive tape.
18. The method of claim 1, wherein the step of cleaning is performed using a dry etch.
19. The method of claim 1, wherein the step of cleaning is performed using a dry etch followed by a wet etch.
20. The method of claim 1, wherein the step of cleaning is performed before breaking the semiconductor wafer into die.
21. The method of claim 20, further comprising the second step of cleaning the semiconductor wafer using another cleaning agent after breaking the semiconductor wafer into die.
22. The method of claim 21, wherein the cleaning agent used in the second step of cleaning does not damage the mounting material.
23. The method of claim 22, wherein the second step of cleaning removes debris resulting from the breaking of the semiconductor wafer.
24. The method of claim 21, wherein the second step of cleaning is performed using a wet etch.
25. The method of claim 24, wherein the wet etch used in the second step of cleaning incorporates the use of ultrasonic agitation.
26. The method of claim 24, wherein the wet etch used in the second step of cleaning incorporates the use of megasonic agitation.
27. The method of claim 21, wherein the second step of cleaning is performed using a dry etch.
28. The method of claim 21, wherein the second step of cleaning is performed using a dry etch followed by a wet etch.
29. The method of claim 28, wherein the wet etch used in the second step of cleaning incorporates the use of megasonic agitation.
30. The method of claim 1, wherein the step of cleaning is performed after breaking the semiconductor wafer into die.
31. The method of claim 30, wherein the step of cleaning also removes slag resulting from the cutting step and debris resulting from the breaking.
32. The method of claim 1, wherein the step of cleaning is performed after the semiconductor wafer has been detached from the mounting material.
33. The method of claim 32, further comprising the step of re-mounting the semiconductor wafer on the mounting material after the step of cleaning.
34. The method of claim 33, further comprising the step of breaking the semiconductor wafer into die.
35. The method of claim 34, further comprising the second step of cleaning using another cleaning agent after the breaking step.
36. The method of claim 35, wherein the cleaning agent used in the second cleaning step does not damage the mounting material.
37. The method of claim 35, wherein the second cleaning step is performed using a dry etch.
38. The method of claim 35, wherein the second cleaning step is performed using a wet etch.
39. The method of claim 38, wherein the wet etch used in the second step of cleaning incorporates the use of ultrasonic agitation.

40. The method of claim 38, wherein the wet etch used in the second step of cleaning incorporates the use of megasonic agitation.

41. The method of claim 35, wherein the second cleaning step is performed using a dry etch followed by a wet etch.

42. The method of claim 41, wherein the wet etch used in the second step of cleaning incorporates the use of ultrasonic agitation.

43. The method of claim 41, wherein the wet etch used in the second step of cleaning incorporates the use of megasonic agitation.

44. The method of claim 1, wherein the inscribing step comprises partially cutting the wafer on the first side, the method further comprising:
  applying a second protective coating to a second side of the wafer;
  cleaning the semiconductor wafer a first cleaning agent;
  mounting the first side of the semiconductor wafer on the mounting material;
  partially cutting the semiconductor wafer on the second side; and
  cleaning the semiconductor wafer with a second cleaning agent, wherein the first cleaning agent removes the first protective coating but does not damage the second protective coating and the mounting material.

45. The method of claim 44, wherein the semiconductor wafer comprises a sapphire substrate and a device layer.

46. The method of claim 45, wherein said device layer comprises a nitride device layer.

47. The method of claim 44, wherein the two cutting steps use a laser.

48. The method of claim 44, wherein the thickness of the wafer is larger than 150 micrometers.

49. The method of claim 44, wherein the method does not comprise the step of thinning the wafer.

50. The method of claim 44, wherein the second cleaning agent removes the second protective coating but does not damage the mounting material.

51. The method of claim 50, wherein the first cleaning agent also removes slag resulting from the inscribing step on the first side.

52. The method of claim 50, wherein the cleaning step using the first cleaning agent is performed using a wet etch.

53. The method of claim 52, wherein the wet etch using the first cleaning agent incorporates the use of ultrasonic agitation.

54. The method of claim 52, wherein the cleaning step using the second cleaning agent is performed using at least a wet etch.

55. The method of claim 54, wherein the wet etch using the second cleaning agent incorporates the use of megasonic agitation.

56. The method of claim 50, wherein the cleaning step using the first cleaning agent is performed using a wet etch after a dry etch.

57. The method of claim 56, wherein the wet etch using the first cleaning agent incorporates the use of ultrasonic agitation.

58. The method of claim 56, wherein the wet etch using the first cleaning agent incorporates the use of megasonic agitation.

59. The method of claim 50, further comprising the step of detaching the wafer from the adhesive tape after the cleaning step using the first cleaning agent.

60. The method of claim 50, wherein the cleaning step using the second cleaning agent is performed using at least a wet etch after a dry etch.

61. The method of claim 60, wherein the wet etch using the second cleaning agent incorporates the use of ultrasonic agitation.

62. The method of claim 47, wherein the cleaning step using the second cleaning agent is performed after breaking the semiconductor wafer.

63. A method for dicing a semiconductor wafer comprising the steps of:
  (a) mounting the semiconductor wafer on an adhesive tape with a second side of the wafer facing the adhesive tape;
  (b) applying a protective coating to a first side of the wafer;
  (c) inscribing the semiconductor wafer into die pattern without breaking the wafer;
  breaking the wafer into die without removing the adhesive tape; and
  cleaning mounted die with a cleaning agent for removing the protective coating and slag.

64. The method of claim 63, wherein the adhesive tape is not damaged by the cleaning agent at the cleaning step.

65. The method of claim 63, wherein the inscribing step uses a laser.

66. The method of claim 63, wherein the semiconductor wafer comprises a sapphire substrate and a device layer.

67. The method of claim 63, wherein step (a) is performed after step (c).

68. The method of claim 1 wherein the inscribing step comprises partially cutting the semiconductor wafer, the method further comprising:
  applying a second protective coating to a second side of the wafer;
  partially cutting the semiconductor wafer on the second side;
  cleaning the second side of the semiconductor wafer using the cleaning agent; and
  wherein the cleaning agent removes the protective coatings on both sides but does not damage the mounting material.

69. The method of claim 68, wherein the mounting material is an adhesive tape.

70. The method of claim 68, wherein the semiconductor wafer comprises a sapphire substrate and a device layer.

71. The method of claim 70, wherein said device layer comprises a nitride device layer.

72. The method of claim 68, wherein the method does not comprise the step of thinning the wafer.

* * * * *

UNITED STATES PATENT AND TRADEMARK OFFICE
CERTIFICATE OF CORRECTION

PATENT NO. : 6,849,524 B2
DATED : February 1, 2005
INVENTOR(S) : Bryan S. Shelton et al.

It is certified that error appears in the above-identified patent and that said Letters Patent is hereby corrected as shown below:

Column 9,
Line 35, delete "first"
Line 40, after "into" insert -- a --
Line 42, after "into" insert -- a mounted --
Line 44, after "cleaning" (first occurrence), insert -- the --
Line 45, delete "first"
Line 56, change "partially" to read -- partial --

Column 10,
Line 17, after "into" insert -- the mounted --
Line 19, after "comprising" change "the" to -- a --
Line 22, after "into" insert -- the mounted --
Line 55, after "the" insert -- re-mounted --
Line 56, after "comprising" change "the" to -- a --

Column 11,
Line 14, change "second" (first occurrence) to -- further --
Line 16, after "wafer" insert -- with --
Line 23, change "first"(second occurence) to -- first-mentioned --
Lines 24 and 37, change "second" to -- further --

Column 12,
Line 13, after "after" insert -- the --; and after "breaking" insert -- of the --
Line 22, after "into" insert -- a --
Line 24, after "into" insert -- a mounted --
Line 26, after "cleaning" (first occurence) insert -- the --

UNITED STATES PATENT AND TRADEMARK OFFICE
CERTIFICATE OF CORRECTION

PATENT NO. : 6,849,524 B2
DATED : February 1, 2005
INVENTOR(S) : Bryan S. Shelton et al.

It is certified that error appears in the above-identified patent and that said Letters Patent is hereby corrected as shown below:

<u>Column 12 (cont.),</u>
Line 39, change "second" (first occurrence) to -- further --

Signed and Sealed this

Seventeenth Day of May, 2005

JON W. DUDAS
*Director of the United States Patent and Trademark Office*